United States Patent
Kanaoka et al.

(10) Patent No.: US 10,058,924 B2
(45) Date of Patent: Aug. 28, 2018

(54) SURFACE-COATED CUTTING TOOL AND METHOD OF MANUFACTURING THE SAME

(71) Applicant: SUMITOMO ELECTRIC HARDMETAL CORP., Itami-shi (JP)

(72) Inventors: Hideaki Kanaoka, Sorachi-gun (JP); Shinya Imamura, Sorachi-gun (JP); Anongsack Paseuth, Sorachi-gun (JP); Takanori Detani, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 0 days.

(21) Appl. No.: 15/103,381

(22) PCT Filed: Aug. 28, 2015

(86) PCT No.: PCT/JP2015/074507
§ 371 (c)(1),
(2) Date: Jun. 10, 2016

(87) PCT Pub. No.: WO2017/037798
PCT Pub. Date: Mar. 9, 2017

(65) Prior Publication Data
US 2017/0209936 A1    Jul. 27, 2017

(51) Int. Cl.
*B23B 27/14*    (2006.01)
*B23C 5/20*    (2006.01)
(Continued)

(52) U.S. Cl.
CPC .............. *B23B 27/148* (2013.01); *B23C 5/20* (2013.01); *C23C 16/029* (2013.01);
(Continued)

(58) Field of Classification Search
None
See application file for complete search history.

(56) References Cited

U.S. PATENT DOCUMENTS 5,766,782 A  *  6/1998  Ljungberg .......... C23C 16/0272
                                                    407/119
2007/0104945 A1    5/2007  Ruppi
(Continued)

FOREIGN PATENT DOCUMENTS

EP            1209255 A2    5/2002
EP            2570510 A1    3/2013
(Continued)

OTHER PUBLICATIONS

International Search Report in PCT International Application No. PCT/JP2015/074507 dated Oct. 6, 2015.

*Primary Examiner* — Vera Katz
(74) *Attorney, Agent, or Firm* — Venable LLP; Michael A. Sartori; Kerri M. Patterson

(57) ABSTRACT

A surface-coated cutting tool includes a base material and a coating formed on the base material. The coating includes an $\alpha$-$Al_2O_3$ layer. The $\alpha$-$Al_2O_3$ layer contains $\alpha$-$Al_2O_3$ crystal grains and sulfur, and has a TC(006) of more than 5 in texture coefficient TC(hkl). The sulfur has a concentration distribution in which a concentration of the sulfur decreases in a direction away from a base-material-side surface of the $\alpha$-$Al_2O_3$ layer, in a thickness direction of the $\alpha$-$Al_2O_3$ layer.

11 Claims, 1 Drawing Sheet

(51) Int. Cl.
 *C23C 16/02* (2006.01)
 *C23C 16/40* (2006.01)

(52) U.S. Cl.
 CPC ........ *C23C 16/403* (2013.01); *B23B 2224/04* (2013.01); *B23B 2224/28* (2013.01); *B23B 2224/36* (2013.01); *B23B 2228/04* (2013.01); *B23B 2228/105* (2013.01); *B23C 2224/04* (2013.01); *B23C 2224/28* (2013.01); *B23C 2224/36* (2013.01); *B23C 2228/04* (2013.01); *B23C 2228/10* (2013.01)

(56) References Cited

U.S. PATENT DOCUMENTS

| | | | |
|---|---|---|---|
| 2008/0050614 A1* | 2/2008 | Holzschuh | C23C 30/005 |
| | | | 428/698 |
| 2008/0187774 A1 | 8/2008 | Ruppi | |
| 2012/0015148 A1 | 1/2012 | Ruppi | |
| 2014/0287228 A1 | 9/2014 | Liu et al. | |
| 2014/0377024 A1 | 12/2014 | Sobana et al. | |
| 2015/0003925 A1 | 1/2015 | Ostlund et al. | |

FOREIGN PATENT DOCUMENTS

| | | | | |
|---|---|---|---|---|
| JP | 2007-125686 A | 5/2007 | | |
| JP | 2008-246664 A | 10/2008 | | |
| JP | 2013-132717 A | 7/2013 | | |
| JP | WO 2013099752 A1 * | 7/2013 | ............ | C23C 16/36 |
| JP | 5555835 B2 | 7/2014 | | |
| JP | 2015-009358 A | 1/2015 | | |

\* cited by examiner

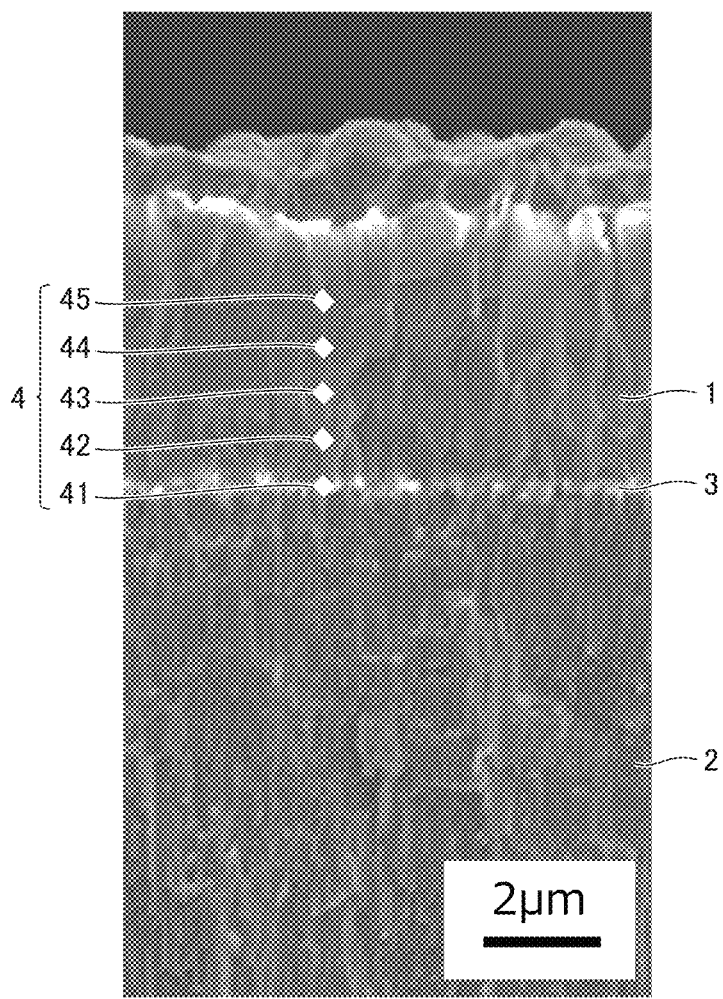

SURFACE-COATED CUTTING TOOL AND METHOD OF MANUFACTURING THE SAME

TECHNICAL FIELD

The present invention relates to a surface-coated cutting tool and a method of manufacturing the same.

BACKGROUND ART

A surface-coated cutting tool having a coating formed on a base material has conventionally been used. Recently, various techniques have been proposed for enhancing the performance of the surface-coated cutting tool, such as a technique for improving the quality of the coating by changing the crystallographic texture of $Al_2O_3$. For example, Japanese Patent Laying-Open No. 2008-246664 (PTD 1) proposes a cutting tool including an $\alpha$-$Al_2O_3$ layer having the (006) texture on a base material of a cemented carbide.

European Patent Publication No. 2570510 (PTD 2) proposes a cutting tool including an $\alpha$-$Al_2O_3$ layer having the (0012) texture and containing 100 ppm or more of sulfur on a base material of a cemented carbide.

CITATION LIST

Patent Document

PTD 1: Japanese Patent Laying-Open No. 2008-246664
PTD 2: European Patent Publication No. 2570510

SUMMARY OF INVENTION

Technical Problem

However, while the cutting tools disclosed in above-referenced PTD 1 and PTD 2 have increased wear resistance, the fracture resistance may be insufficient or the effect of reducing the friction coefficient may not sufficiently be obtained.

The present invention has been made in view of the above-described circumstances, and an object of the present invention is to provide a surface-coated cutting tool which can achieve an extended life by its coating formed to have both excellent wear resistance and excellent slidability, and to provide a method of manufacturing the surface-coated cutting tool.

Solution to Problem

A surface-coated cutting tool according to an aspect of the present invention includes a base material and a coating formed on the base material. The coating includes an $\alpha$-$Al_2O_3$ layer. The $\alpha$-$Al_2O_3$ layer contains a plurality of $\alpha$-$Al_2O_3$ crystal grains and sulfur, and has a TC(006) of more than 5 in texture coefficient TC(hkl). The sulfur has a concentration distribution in which a concentration of the sulfur decreases in a direction away from a base-material-side surface of the $\alpha$-$Al_2O_3$ layer, in a thickness direction of the $\alpha$-$Al_2O_3$ layer.

Advantageous Effects of Invention

According to the foregoing, both the excellent wear resistance and the excellent slidability are exhibited, and the life can be extended.

BRIEF DESCRIPTION OF DRAWINGS

FIG. 1 is a photomicrograph as a substitute for a diagram, measurement points in an $\alpha$-$Al_2O_3$ layer used for measuring the content of sulfur (S) by EDS being indicated on the photomicrograph.

DESCRIPTION OF EMBODIMENTS

Description of Embodiment of the Invention

The inventors of the present invention have thoroughly conducted studies for solving the above-described problems, and finally reached the present invention. In a process of nucleation of an $\alpha$-$Al_2O_3$ layer, a large amount of $H_2S$ was introduced in a pulsed form to thereby generate a sulfur concentration distribution in the thickness direction of the $\alpha$-$Al_2O_3$ layer. Specifically, in the sulfur concentration distribution, the sulfur concentration decreases in the direction away from the base material in the thickness direction of the $\alpha$-$Al_2O_3$ layer. It was found that excellent wear resistance and excellent slidability can thus be exhibited.

First of all, the present invention will be described based on features listed below.

[1] A surface-coated cutting tool according to an aspect of the present invention includes a base material and a coating formed on the base material. The coating includes an $\alpha$-$Al_2O_3$ layer. The $\alpha$-$Al_2O_3$ layer contains a plurality of $\alpha$-$Al_2O_3$ crystal grains and sulfur, and has a TC(006) of more than 5 in texture coefficient TC(hkl). The sulfur has a concentration distribution in which a concentration of the sulfur decreases in a direction away from a base-material-side surface of the $\alpha$-$Al_2O_3$ layer, in a thickness direction of the $\alpha$-$Al_2O_3$ layer. The surface-coated cutting tool having the above-specified features can exhibit excellent wear resistance and excellent slidability.

[2] Preferably, the $\alpha$-$Al_2O_3$ crystal grains having a grain size of 0.2 to 2 µm occupy 20 to 80% by area of a measurement surface, the measurement surface is in parallel with a surface of the $\alpha$-$Al_2O_3$ layer or parallel with an interface between the $\alpha$-$Al_2O_3$ layer and an adjacent layer, the adjacent layer is adjacent to the $\alpha$-$Al_2O_3$ layer and located on an opposite side to the base material, and the measurement surface is located at a depth of 0.5 µm from the surface of the $\alpha$-$Al_2O_3$ layer or the interface. Accordingly, the wear resistance can be improved.

[3] Preferably, the TC(006) is more than 6. Accordingly, the wear resistance and the slidability of the tool are effectively improved.

[4] Preferably, the TC(006) is more than 7. Accordingly, the wear resistance and the slidability of the tool are more effectively improved.

[5] Preferably, a maximum concentration Csmax of the sulfur in the concentration distribution appears in a region of 1 µm from an interface between the $\alpha$-$Al_2O_3$ layer and the base material, or from an interface between the $\alpha$-$Al_2O_3$ layer and a layer adjacent to the $\alpha$-$Al_2O_3$ layer and located on the same side as the base material, in the thickness direction of the $\alpha$-$Al_2O_3$ layer; a minimum concentration Csmin of the sulfur in the concentration distribution appears in a region of 1 µm from a surface of the $\alpha$-$Al_2O_3$ layer or from an interface between the $\alpha$-$Al_2O_3$ layer and a layer adjacent to the $\alpha$-$Al_2O_3$ layer and located on an opposite side to the base material, in the thickness direction of the $\alpha$-$Al_2O_3$ layer; and the Csmax is 0.005 to 1 at. %, the Csmin is 0.001 to 0.1 at. %, and the Csmax and the Csmin meet a relation Csmax>Csmin. Accordingly, the wear resistance can be improved.

[6] Preferably, a maximum concentration Csmax of the sulfur in the concentration distribution is 0.005 to 1 at. %. Accordingly, particularly the slidability can be improved.

[7] Preferably, the $\alpha$-$Al_2O_3$ layer has an average layer thickness of 1 to 15 µm. Accordingly, both the wear resistance and the fracture resistance can be achieved.

[8] Preferably, in a surface of the coating, an outermost surface layer in which any one of Ti carbide, Ti nitride, and Ti boride is a main component is disposed. Accordingly, identification of the corner of the tool is facilitated.

[9] Preferably, the coating has an intermediate layer between the $\alpha$-$Al_2O_3$ layer and the base material, and the intermediate layer contains acicular TiCNO or acicular TiBN and has an average layer thickness of 0.3 to 1 µm, and a difference between a maximum thickness and a minimum thickness of the intermediate layer is 0.3 µm or more. Accordingly, the adhesion of the $\alpha$-$Al_2O_3$ layer in the coating can be improved.

[10] A method of manufacturing a surface-coated cutting tool according to an aspect of the present invention includes the step of forming, on the base material by a CVD method, the coating including the $\alpha$-$Al_2O_3$ layer. In the step, a content of $H_2S$ gas contained in a raw material gas in an initial stage of formation of the $\alpha$-$Al_2O_3$ layer is 0.5 to 5 vol %, and the content of $H_2S$ gas is momentarily increased to 0.65 to 7 vol %. Accordingly, a surface-coated cutting tool that can exhibit excellent wear resistance and excellent slidability can be manufactured.

Details of Embodiment of the Invention

In the following, an embodiment of the present invention (hereinafter also referred to as "present embodiment") will be described in further detail.

<Surface-Coated Cutting Tool>

A surface-coated cutting tool of the present embodiment includes a base material and a coating formed on the base material. The coating preferably covers the entire surface of the base material. However, even the cutting tool in which a part of the base material is not covered with this coating or the structure and makeup of the coating is partially different does not go beyond the scope of the present invention.

The surface-coated cutting tool of the present embodiment can suitably be used as a cutting tool such as drill, end mill, indexable insert for the drill, indexable insert for the end mill, indexable insert for milling, indexable insert for turning, metal-slitting saw, gear-cutting tool, reamer, tap, or the like.

<Base Material>

As the base material, any base material conventionally known as a base material of this type may be used. For example, the base material is preferably any of a cemented carbide (including, for example, a WC-based cemented carbide, a cemented carbide containing WC and Co, and a cemented carbide containing WC and Co and additionally a carbonitride of Ti, Ta, Nb or the like), a cermet (having a main component such as TiC, TiN, TiCN or the like), a high-speed steel, a ceramic material (such as titanium carbide, silicon carbide, silicon nitride, aluminum nitride, aluminum oxide, or the like), cubic boron nitride sintered body, and a diamond sintered body.

Among these variety of base materials, the cemented carbide, particularly WC-based cemented carbide, or the cermet (particularly TiCN-based cermet) is preferably selected. These base materials are particularly excellent in balance between hardness and strength at high temperature, and have excellent characteristics for the base material of the surface-coated cutting tool for the above-described use.

In the case where the surface-coated cutting tool is an indexable insert or the like, the base material may have or may not have a chip breaker. Moreover, the shape of the edge ridgeline may be any of a sharp edge (the ridge where the rake face and the flank face meet each other), a honed edge (a sharp edge processed to be rounded), a negative land (beveled), and a combination of the honed edge and the negative land.

<Coating>

The coating includes an $\alpha$-$Al_2O_3$ layer. For example, the coating may be made up of a plurality of layers including at least one $\alpha$-$Al_2O_3$ layer and further including other layers.

Examples of the aforementioned other layers may be TiCNO layer, TiBN layer, TiC layer, TiN layer, TiAlN layer, TiSiN layer, AlCrN layer, TiAlSiN layer, TiAlNO layer, AlCrSiCN layer, TiCN layer, TiSiC layer, CrSiN layer, AlTiSiCO layer, TiSiCN layer, and the like. A compound expressed herein by a chemical formula like the above-referenced ones includes the compound with any of all conventionally known atomic ratios if the atomic ratio is not particularly limited, and the compound is not necessarily limited to the compound with a stoichiometric ratio.

For example, in the case of an expression "TiAlN," the ratio of the number of atoms between the elements constituting TiAlN is not limited to Ti:Al:N=0.5:0.5:1, and includes all conventionally known ratios of the number of atoms. This is applied as well to any expressions of compounds other than "TiAlN." Moreover, in the present embodiment, the metal element such as titanium (symbol: Ti), aluminum (symbol: Al), silicon (symbol: Si), zirconium (symbol: Zr), or chromium (symbol: Cr) and the non-metal element such as nitrogen (symbol: N), oxygen (symbol: O), or carbon (symbol: C) may not necessarily constitute a stoichiometric composition.

The coating has an average thickness of 3 to 35 µm (3 µm or more and 35 µm or less, it should be noted that a numerical value range expressed with "-" or "to" herein includes the numerical values of the upper limit and the lower limit). Preferably, the coating has an average thickness of 5 to 20 µm. If this average thickness is less than 3 µm, there is a possibility that the wear resistance is insufficient. If this average thickness is more than 35 µm, there is a possibility that the coating is peeled off or broken highly frequently when a large stress is applied between the coating and the base material during intermittent processing.

<$\alpha$-$Al_2O_3$ Layer>

The $\alpha$-$Al_2O_3$ layer contains a plurality of $\alpha$-$Al_2O_3$ (aluminum oxide having an $\alpha$-type crystal structure) crystal grains and sulfur (symbol: S). The $\alpha$-$Al_2O_3$ layer includes polycrystalline $\alpha$-$Al_2O_3$ containing a plurality of $\alpha$-$Al_2O_3$ crystal grains. The crystal grains usually have a grain size on the order of 0.1 to 2 µm.

In the $\alpha$-$Al_2O_3$ layer, many $\alpha$-$Al_2O_3$ crystal grains are in the (006) orientation. The $\alpha$-$Al_2O_3$ layer has a TC(006) of more than 5 in texture coefficient TC(hkl) expressed by the following expression (1).

$$TC(hkl) = \frac{I(hkl)}{I_0(hkl)} \left\{ \frac{1}{n} \sum_{1}^{n} \frac{I(hkl)}{I_0(hkl)} \right\}^{-1} \quad (1)$$

In the expression (1), I(hkl) represents an x-ray diffraction intensity of a (hkl) reflection plane, and $I_0$(hkl) represents a standard intensity according to PDF card No. 00-010-0173 of the ICDD. In the expression (1), n represents the number of reflections used for the calculation and is eight in the present embodiment. (hkl) planes used for reflection are (012), (104), (110), (006), (113), (024), (116), and (300).

ICDD (registered trademark) is an abbreviation for International Center of Diffraction Data. PDF (registered trademark) is an abbreviation for Power Diffraction File.

TC(006) of the $\alpha$-$Al_2O_3$ layer in the present embodiment can be expressed by the following expression (2).

$$TC(006) = \frac{I(006)}{I_0(006)} \left\{ \frac{1}{8} \sum_1^8 \frac{I(hkl)}{I_0(hkl)} \right\}^{-1} \quad (2)$$

"TC(006) of more than 5 in texture coefficient TC(hkl)" means that a numerical value given by the above expression (2) which is determined by substituting TC(006) in the expression (1) is more than 5. The $\alpha$-$Al_2O_3$ layer having a TC(006) of more than 5 has effective hardness and Young's modulus against impact and vibration under severe cutting conditions, and therefore can contribute to improvement of the wear resistance.

The value of TC(006) is preferably more than 6 and more preferably more than 7. A greater value of TC(006) enables effective improvement of the wear resistance. While the upper limit of the value of TC(006) is not limited, the upper limit may be 8 or less since the number of reflection planes used for the calculation is 8.

This TC(hkl) can be measured through analysis by means of an x-ray diffractometer. TC(hkl) can for example be measured by means of SmartLab (registered trademark) manufactured by Rigaku Corporation (scanning speed: 21.7°/min, step: 0.01°, scanning range: 15 to 140°) under the following conditions. It should be noted that the result of measurement of the TC(hkl) by means of the x-ray diffractometer is herein referred to as "XRD result."

characteristic x-ray: Cu-K$\alpha$
tube voltage: 45 kV
tube current: 200 mA
filter: multilayer mirror
optical system: focusing method
x-ray diffraction method: $\theta$-$2\theta$ method <Concentration Distribution of Sulfur Contained in $\alpha$-$Al_2O_3$ Layer>

Sulfur (in some cases referred to hereinafter as "S" which is the atomic symbol of sulfur) contained in the $\alpha$-$Al_2O_3$ layer has a concentration distribution in which the concentration of sulfur decreases in the direction away from a base-material-side surface of the $\alpha$-$Al_2O_3$ layer in the thickness direction of the $\alpha$-$Al_2O_3$ layer. Specifically, in the case for example where point A, point B, and point C are set in this order in the direction away from the base-material-side surface of the $\alpha$-$Al_2O_3$ layer and the S content at each of these points is measured, the concentration distribution meets the relation "S content at point A>S content at point B>S content at point C." Such a form of the concentration distribution of S enables excellent wear resistance to be achieved and enables significant improvement of the slidability.

Here, sulfur has "a concentration distribution in which the concentration of sulfur decreases in the direction away from a base-material-side surface of the $\alpha$-$Al_2O_3$ layer in the thickness direction of the $\alpha$-$Al_2O_3$ layer" means that the $\alpha$-$Al_2O_3$ layer may include a portion where the concentration of sulfur decreases in the direction away from the base-material-side surface of the $\alpha$-$Al_2O_3$ layer in the thickness direction of the $\alpha$-$Al_2O_3$ layer. It also means that a relation "S content at point X>S content at point Y" is always met, where point X is a point directly above the interface between the $\alpha$-$Al_2O_3$ layer and the base material (in the case where an adjacent layer is located between the $\alpha$-$Al_2O_3$ layer and the base material, a point immediately above the interface between the $\alpha$-$Al_2O_3$ layer and the adjacent layer), and point Y is a point immediately below the surface of the $\alpha$-$Al_2O_3$ layer (in the case where another adjacent layer is located on the $\alpha$-$Al_2O_3$ layer oppositely to the base material, a point immediately below the interface between the $\alpha$-$Al_2O_3$ layer and this adjacent layer).

As long as the $\alpha$-$Al_2O_3$ layer includes the portion where the concentration of sulfur decreases in the direction away from the base-material-side surface of the $\alpha$-$Al_2O_3$ layer and the relation "S content at point X>S content at point Y" is met, the $\alpha$-$Al_2O_3$ layer may include a portion where the concentration of S is constant in the direction away from the base-material-side surface of the $\alpha$-$Al_2O_3$ layer. Moreover, the $\alpha$-$Al_2O_3$ layer may include a portion where the concentration of S increases in the direction away from the base-material-side surface of the $\alpha$-$Al_2O_3$ layer or a portion where no sulfur is contained, for example.

Preferably, a maximum concentration Csmax of sulfur in the concentration distribution appears in a region of 1 $\mu$m from an interface between the $\alpha$-$Al_2O_3$ layer and the base material, or from an interface between the $\alpha$-$Al_2O_3$ layer and a layer adjacent to the $\alpha$-$Al_2O_3$ layer and located on the same side as the base material, in the thickness direction of the $\alpha$-$Al_2O_3$ layer. Preferably, a minimum concentration Csmin of the sulfur in the concentration distribution appears in a region of 1 $\mu$m from a surface of the $\alpha$-$Al_2O_3$ layer or from an interface between the $\alpha$-$Al_2O_3$ layer and a layer adjacent to the $\alpha$-$Al_2O_3$ layer and located on an opposite side to the base material, in the thickness direction of the $\alpha$-$Al_2O_3$ layer. Preferably, Csmax is 0.005 to 1 at. %, the Csmin is 0.001 to 0.1 at. %, and the Csmax and the Csmin meet a relation Csmax>Csmin. Accordingly, the wear resistance can be improved. For example, Csmax may appear at a location immediately above the interface between the $\alpha$-$Al_2O_3$ layer and the base material or a location directly above an adjacent layer if the adjacent layer is located between the $\alpha$-$Al_2O_3$ layer and the base material. Csmin may appear at a location immediately below the surface of the $\alpha$-$Al_2O_3$ layer or a location immediately below another adjacent layer if this adjacent layer is located on the $\alpha$-$Al_2O_3$ layer oppositely to the base material.

More preferably, the difference between Csmax and Csmin is 0.1 at. % or more. The upper limit of the difference between Csmax and Csmin may be 0.9 at. %. If the difference is larger than this, there is a possibility that coarse crystal grains may be generated. Moreover, Csmax is preferably 0.005 to 1 at. %, more preferably 0.05 to 1 at. %, and still more preferably 0.1 to 0.7 at. %. Accordingly, the slidability can be improved. If Csmax is less than 0.005 at. %, the slidability is insufficient and there is a possibility that adhesion of the workpiece is likely to increase during cutting. If Csmax is more than 1 at. %, there is a possibility that the fracture resistance is deteriorated.

Preferably, Csmin is 0.001 to 0.01 at. %. In the case where Csmin is less than 0.001 at. %, further enhancement of the wear resistance is difficult to achieve.

In the present embodiment, the content of S in the $\alpha$-$Al_2O_3$ layer is expressed by at. %. Specifically, the S content may be expressed by an atomic composition percentage [S/(Al+O+C+Cl+Ti+S)×100] where the denominator is the sum of respective numbers of atoms of Al, O, C, chlorine (symbol: Cl), Ti, and S, and the numerator is the number of atoms of S.

The S content can be measured in the following way. Polishing by ion milling is performed on a coating cross section extending in parallel with a cross section of the $\alpha$-$Al_2O_3$ layer in the thickness direction thereof, and the polished cross section is analyzed by means of an energy-dispersive x-ray spectroscopy (EDS) analyzer using a field emission scanning electron microscope. Moreover, the S content can be measured in further detail by means of the WDS (Wavelength Dispersive X-ray Spectroscopy) analysis method.

The conditions of the aforementioned ion milling are for example as follows.
  acceleration voltage: 6 kV
  ion beam incident angle: 0 to 5° from the normal line
  ion beam irradiation time: 300 minutes In the present embodiment, the S content was measured by means of an EDS analyzer using a field emission scanning electron microscope of SU6600 (model No.) manufactured by Hitachi High-Technologies Corporation. For measurement, the acceleration voltage of the field emission scanning electron microscope was set to 15 kV. The conditions of EDS were set so that the number of frames was 150 and selected elements were C, O, Al, S, Cl, Ti. As shown in FIG. 1, the S content in an $\alpha$-$Al_2O_3$ layer 1 was measured at each of points located at predetermined intervals in the thickness direction, from the interface (TiCNO layer 3) between $\alpha$-$Al_2O_3$ layer 1 and a layer (TiCN layer 2) which is located between the $\alpha$-$Al_2O_3$ layer and the base material, toward the surface of the coating, and the distribution of the S content was analyzed.

In FIG. 1, the measurement points in $\alpha$-$Al_2O_3$ layer that were used for measuring the S content by EDS are indicated on a photomicrograph. In FIG. 1, the coating includes TiCN layer 2 formed on the base material, TiCNO layer 3 deposited on this TiCN layer 2, and $\alpha$-$Al_2O_3$ layer 1 deposited on TiCNO layer 3. For this analysis, measurement points 4 (first measurement point 41, second measurement point 42, third measurement point 43, fourth measurement point 44, fifth measurement point 45) were set from the position directly above TiCNO layer 3 which is the interface between $\alpha$-$Al_2O_3$ layer 1 and TiCN layer 2, at predetermined intervals (at intervals of 1.0 μm for example), in the thickness direction toward the surface of the coating. Then, the S content was measurement at each of the measurement points from first measurement point 41 to fifth measurement point 45.

<Grain Size of $\alpha$-$Al_2O_3$ Crystal Grains Contained in $\alpha$-$Al_2O_3$ Layer>

Preferably, in the $\alpha$-$Al_2O_3$ layer, the $\alpha$-$Al_2O_3$ crystal grains having a grain size of 0.2 to 2 μm occupy 20 to 80% by area of a measurement surface which is parallel with a surface of the $\alpha$-$Al_2O_3$ layer or parallel with an interface between the $\alpha$-$Al_2O_3$ layer and an adjacent layer, the adjacent layer is adjacent to the $\alpha$-$Al_2O_3$ layer and located on an opposite side to the base material, and the measurement surface is located at a depth of 0.5 μm from the surface or the interface. If the $\alpha$-$Al_2O_3$ crystal grains occupying 20 to 80% by area of the measurement surface have a grain size of less than 0.2 μm, there is a possibility that the fracture resistance is deteriorated. If the grain size is more than 2 μm, there is a possibility that the wear resistance is deteriorated.

The upper limit of the grain size is preferably 1.85 μm. The lower limit of the grain size is 0.2 μm. As long as the value of the grain size is not less than 0.2 μm, the value is a preferable value. This is for the reasons that the fracture resistance can be improved simultaneously with the wear resistance as long as the grain size falls in the range as defined above.

Moreover, it is not preferable that the ratio of $\alpha$-$Al_2O_3$ crystal grains with a grain size of 0.2 to 2 μm is less than 20% by area or more than 80% by area of the measurement surface, since the fracture resistance and the wear resistance cannot be improved in this case. A more preferred ratio of the $\alpha$-$Al_2O_3$ crystal grains with a grain size of 0.2 to 2 μm is 50 to 70% by area.

In the present embodiment, measurement of the grain size of the $\alpha$-$Al_2O_3$ crystal grains in the measurement surface of the $\alpha$-$Al_2O_3$ layer was performed on a coating cross section extending in parallel with a cross section of the $\alpha$-$Al_2O_3$ layer in the thickness direction thereof. Specifically, in this coating cross section, a location at 0.5 μm away from the surface of the $\alpha$-$Al_2O_3$ layer (from the interface between the $\alpha$-$Al_2O_3$ layer and an adjacent layer if the adjacent layer is located on the $\alpha$-$Al_2O_3$ layer oppositely to the base material) toward the inside of the $\alpha$-$Al_2O_3$ layer was observed with a field emission scanning electron microscope. The grain size of the $\alpha$-$Al_2O_3$ crystal grains can be measured from a photomicrograph image thereof by means of the section method. The coating cross section may be polished by ion milling, a photomicrograph image of the polished surface may be used to conduct EBSD analysis, and the grain size of the $\alpha$-$Al_2O_3$ crystal grains may be measured by this analysis.

As the section method used for measurement of the grain size of the $\alpha$-$Al_2O_3$ crystal grains, a method was employed according to which the number of crystal grains across a certain width was counted and the width was divided by the counted number of crystal grains to thereby calculate the grain size.

<Thickness of $\alpha$-$Al_2O_3$ Layer>

The $\alpha$-$Al_2O_3$ layer preferably has an average thickness of 1 to 15 μm. Accordingly, both the wear resistance and the fracture resistance can be achieved. If the average thickness of the $\alpha$-$Al_2O_3$ layer is less than 1 μm, there is a possibility that wear is likely to increase. If the average thickness is more than 15 μm, there is a possibility that the fracture resistance is deteriorated.

<Other Layers>

The coating may include layers other than the $\alpha$-$Al_2O_3$ layer as described above. An example of the other layers is a TiCN layer for example. This TiCN layer is excellent in wear resistance and therefore can provide higher wear resistance to the coating. The TiCN layer is particularly preferably formed by the MT-CVD (medium temperature CVD) method. Among the CVD methods, the MT-CVD method can be used to form a layer at a relatively low temperature of approximately 800 to 1000° C., and can reduce damage to the base material caused by heating in the process of forming the layer. The TiCN layer may be disposed for example between the $\alpha$-$Al_2O_3$ layer and the base material.

The average thickness of the TiCN layer is preferably 2 to 20 μm. If this average thickness is less than 2 μm, there is a possibility that wear is likely to increase. If this average thickness is more than 20 μm, there is a possibility that the fracture resistance is deteriorated.

It should be noted that an outermost surface layer and an intermediate layer described below are also included in the other layers.

<Outermost Surface Layer>

Preferably, in a surface of the coating, an outermost surface layer in which any one of Ti carbide, Ti nitride, and Ti boride is a main component is disposed. The outermost surface layer is a layer located at the outermost surface position in the coating. It should be noted, however, that the outermost surface layer may not be formed in a region including the edge ridgeline. In the case where other layers are not formed on the $\alpha\text{-}Al_2O_3$ layer, the outermost surface layer is disposed directly on the $\alpha\text{-}Al_2O_3$ layer.

"Any one of Ti carbide, Ti nitride, and Ti boride is a main component" means that the outermost surface layer contains 90 mass % or more of any one of Ti carbide, Ti nitride, and Ti boride. It preferably means that the outermost surface layer is made of any one of Ti carbide, Ti nitride, and Ti boride, besides inevitable impurities.

In the case where the outermost surface layer is formed, the outermost surface layer has an effect of assuming a clear chromatic color for example to thereby make it easy to identify a corner (identify a used part) of a cutting insert after used for cutting.

The outermost surface layer preferably has an average thickness of 0.05 to 1 µm. The upper limit of the average thickness of the outermost surface layer is preferably 0.8 µm and more preferably 0.6 µm. The lower limit of the average thickness of the outermost surface layer is preferably 0.1 µm and more preferably 0.2 µm. If the average thickness is less than 0.05 µm, there is a possibility that the effect of improving the fracture resistance is not sufficiently provided when a compressive residual stress is applied to the coating, and the fracture resistance is not improved. If the average thickness is more than 1 µm, there is a possibility that the adhesion between the outermost surface layer and a layer adjacent to the outermost surface layer is deteriorated.

<Intermediate Layer>

Preferably, the coating has an intermediate layer between the $\alpha\text{-}Al_2O_3$ layer and the base material. The intermediate layer is formed to contain acicular TiCNO or acicular TiBN in acicular shape. For example, the intermediate layer is preferably disposed between the $\alpha\text{-}Al_2O_3$ layer and a TiCN layer which is disposed between the $\alpha\text{-}Al_2O_3$ layer and the base material, and more preferably disposed between the $\alpha\text{-}Al_2O_3$ layer and the TiCN layer and in contact with both the $\alpha\text{-}Al_2O_3$ layer and the TiCN layer, since the adhesion of the $\alpha\text{-}Al_2O_3$ layer in the coating is increased. The intermediate layer may be formed by any known method.

The intermediate layer preferably has an average thickness of 0.3 to 1 µm, since the adhesion of the $\alpha\text{-}Al_2O_3$ layer in the coating is further increased. The average thickness of the intermediate layer is more preferably 0.4 to 0.8 µm. Further, a difference between a maximum thickness and a minimum thickness of the intermediate layer is preferably 0.3 µm or more. Accordingly, increase of the adhesion of the $\alpha\text{-}Al_2O_3$ layer in the coating can be ensured. If the difference between the maximum thickness and the minimum thickness of the intermediate layer is less than 0.3 µm, there is a possibility that the effect of increasing the adhesion of the $\alpha\text{-}Al_2O_3$ layer is not sufficiently obtained. The upper limit of the difference between the maximum thickness and the minimum thickness of the intermediate layer is 0.9 µm. If the difference is more than 0.9 µm, there is a possibility that the $\alpha\text{-}Al_2O_3$ crystal grains are non-uniform and the adhesion is deteriorated.

The method of measuring the thickness of the intermediate layer is similar to the method used for measuring the grain size of the $\alpha\text{-}Al_2O_3$ crystal grains. Namely, a coating cross section extending in parallel with a cross section of the $\alpha\text{-}Al_2O_3$ layer in the thickness direction thereof is observed with a field emission scanning electron microscope to measure the thickness of the intermediate layer. The average thickness of the intermediate layer can be determined for example in the following way. From a plurality of locations of the intermediate layer at which the thickness thereof is measured by the above-described measurement method, any several thicknesses are selected, and the average of the thicknesses at the several locations is calculated. The maximum thickness and the minimum thickness of the intermediate layer can also be determined by taking the maximum thickness and the minimum thickness from thicknesses at multiple locations of the intermediate layer measured by the above-described measurement method. Moreover, the measurement can also be conducted by polishing the cross section by ion milling and using a microphotograph image of the polished cross section.

<Method of Manufacturing Coating>

A method of manufacturing a surface-coated cutting tool in the present embodiment includes the step of forming, on the base material by a CVD method, the coating including the $\alpha\text{-}Al_2O_3$ layer. In the step, a content of $H_2S$ gas contained in a raw material gas in an initial stage of formation of the $\alpha\text{-}Al_2O_3$ layer is 0.5 to 5 vol %, and the content of $H_2S$ gas is momentarily increased to 0.65 to 7 vol %. Here, the initial stage of formation of the $\alpha\text{-}Al_2O_3$ layer is a stage in which nucleation of $\alpha\text{-}Al_2O_3$ crystal grains is done.

The surface-coated cutting tool can appropriately be manufactured by forming a coating on a base material by the chemical vapor deposition (CVD) method. In the case where the CVD method is used, the deposition temperature is 800 to 1200° C. which is higher than the temperature for the physical vapor deposition method and thus the adhesion between the coating and the base material is improved. In the case where layers other than the $\alpha\text{-}Al_2O_3$ layer are formed as layers of the coating, these layers may be formed by a conventionally known method. Moreover, the thickness of the $\alpha\text{-}Al_2O_3$ layer and respective thicknesses of the other layers can be adjusted by appropriately regulating the deposition time (the deposition rate for each layer is about 0.5 to 2.0 µm/hour).

The $\alpha\text{-}Al_2O_3$ layer can be formed in the following manner by means of the CVD method for example.

First, by a known method, a TiCN layer is formed on another layer formed on the base material or a TiCN layer is formed on the base material without another layer interposed therebetween, and a TiCNO layer is formed on a surface of the TiCN layer. Further, a surface of the TiCNO layer is oxidized to cause nucleation of $\alpha\text{-}Al_2O_3$ crystal grains. Subsequently, an $\alpha\text{-}Al_2O_3$ layer is formed ($\alpha\text{-}Al_2O_3$ crystal is grown). For nucleation of $\alpha\text{-}Al_2O_3$ crystal grains and formation of the $\alpha\text{-}Al_2O_3$ layer (growth of $\alpha\text{-}Al_2O_3$ crystal), the content of $H_2S$ gas contained in a raw material gas to be introduced is set to a content selected from a range of 0.5 to 5 vol %. The content of each gas in the raw material gas other than the $H_2S$ gas is 1.3 to 2.5 vol % of $AlCl_3$, 2.8 to 6 vol % of HCl, 1 to 5 vol % of CO, 0.4 to 3 vol % of $CO_2$, 0.002 to 0.008 vol % of $O_2$, and the remainder of $H_2$. The temperature in a furnace of a CVD apparatus is 970 to 1020° C. and the pressure in the furnace is 70 to 110 hPa.

It should be noted that the surface of the TiCNO layer is oxidized by CO, $CO_2$ and $O_2$ in the composition of the raw material gas for nucleation of $\alpha\text{-}Al_2O_3$ crystal grains.

During nucleation of the $\alpha$-$Al_2O_3$ crystal grains, the raw material gas is introduced in which the content of $H_2S$ gas contained in the raw material gas is increased momentarily (in pulsed manner) from the content selected from a range of 0.5 to 5 vol %. This operation can be performed once or performed twice or more. Namely, firstly the content of $H_2S$ gas is changed in pulsed manner to cause nucleation of the $\alpha$-$Al_2O_3$ crystal grains, and thereafter the raw material gas having the above-described composition is used to grow the $\alpha$-$Al_2O_3$ crystal grains and form the $\alpha$-$Al_2O_3$ layer. In this way, the $\alpha$-$Al_2O_3$ layer can be formed having a concentration distribution of S in which the concentration of S decreases in the direction away from the base-material-side surface of the $\alpha$-$Al_2O_3$ layer in the thickness direction. It should be noted in the case where the content of $H_2S$ gas is momentarily increased during nucleation, the increase may be adjusted by decreasing the content of $H_2$ gas which is the remainder of the raw material gas. This is convenient since respective contents of the other gases, the temperature in the furnace of the CVD apparatus, and the pressure in the furnace can be kept constant.

Preferably, the momentarily increased content (pulse height) of $H_2S$ gas is 130 to 160% relative to the content selected from a range of 0.5 to 5 vol %. If this is less than 130%, there is a possibility that Csmax is 0.005 at. % or less. If this is more than 160%, there is a possibility that the crystal grains are coarsened and excellent wear resistance cannot be obtained.

It has conventionally been pointed out that an excessively increased concentration of introduced $H_2S$ gas causes reaction of $\alpha$-$Al_2O_3$ crystal grains before formed on the base material, the crystal grains are coarsened, and abnormal growth of the coating is caused. In the case of the surface-coated cutting tool in the present embodiment, abnormal growth of the $\alpha$-$Al_2O_3$ crystal grains can be suppressed by introducing the $H_2S$ gas so that the concentration is changed in pulsed manner even when the concentration of the introduced $H_2S$ gas is high. As a result, the concentration of sulfur in the $\alpha$-$Al_2O_3$ layer can efficiently be increased and the $\alpha$-$Al_2O_3$ layer having a concentration distribution of S in which the concentration of S decreases in the direction away from the base-material-side surface of the $\alpha$-$Al_2O_3$ layer in the thickness direction thereof can be formed. As a result of evaluation of the performance of the $\alpha$-$Al_2O_3$ layer having such a concentration distribution of S, it is seen that the effect that the $\alpha$-$Al_2O_3$ layer has excellent wear resistance and excellent slidability as will be described later herein can be obtained. In order to more effectively obtain the excellent wear resistance and the excellent slidability, $O_2$ may be added in addition to $CO_2$ as oxygen source of the raw material gas. This is for the reason that addition of $O_2$ enables high (006) orientation to be obtained more effectively.

Moreover, $H_2S$ gas contained in the raw material gas may be replaced with gas which is a combination of $SO_2$ gas and $H_2S$ gas, a combination of $SF_6$ gas and $H_2S$ gas, or a combination of $SO_2$ gas and $SF_6$ gas with $H_2S$ gas. In this case as well, the concentration distribution of S can be formed in the thickness direction of the $\alpha$-$Al_2O_3$ layer.

EXAMPLES

In the following, the present invention will be described in further detail with reference to Examples. The present invention, however, is not limited to them.

Example 1

<Preparation of Base Material>

A base material formed of a cemented carbide base material (manufactured by Sumitomo Electric Industries, Ltd.) with a shape of CNMG120408 defined under JIS (Japanese Industrial Standard) B 4120 (1998) was prepared. Prepared base materials were grouped into seven groups named Sample A1 to Sample A7. For each group, six base materials were prepared. These base materials had a composition made up of 87.0 wt % of WC, 8.0 wt % of Co, 2.5 wt % of TiC, 1.5 wt % of NbC, and 1.0 wt % of TaC.

As will be described later herein, Sample A1 to Sample A4 are Examples and Sample A5 to Sample A7 are Comparative Examples.

<Formation of Coating>

The base materials of Sample A1 to Sample A7 were subjected to honing by a known method and set in a chemical vapor deposition apparatus, and a coating was formed on a surface of each base material by the CVD method. Regarding the conditions for forming the coating, the conditions for forming each layer except for the $\alpha$-$Al_2O_3$ layer are indicated in the following Table 1.

TABLE 1

| | | conditions for forming layer | | |
|---|---|---|---|---|
| | composition of raw material gas (vol %) | temperature (° C.) | pressure (hPa) | total gas amount (L/min) |
| TiN (underlayer) | $TiCl_4$ = 2%, $N_2$ = 25%, $H_2$ = remainder | 900 | 200 | 60 |
| TiCN | $TiCl_4$ = 2%, $CH_3CN$ = 0.5%, $N_2$ = 20%, $H_2$ = remainder | 850 | 80 | 95 |
| TiCNO | $TiCl_4$ = 1%, CO = 1%, $CH_4$ = 5%, $N_2$ = 10%, $H_2$ = remainder | 1000 | 250 | 60 |
| TiC | $TiCl_4$ = 2%, $CH_4$ = 7%, $H_2$ = remainder | 1000 | 500 | 60 |
| TiN (outermost surface layer) | $TiCl_4$ = 1.5%, $N_2$ = 40%, $H_2$ = remainder | 1000 | 800 | 90 |

In the process of forming the $\alpha$-$Al_2O_3$ layer by the CVD method, the surface of the TiCNO layer formed on the surface of the TiCN layer was oxidized to cause nucleation of $\alpha$-$Al_2O_3$ crystal grains, and subsequently the $\alpha$-$Al_2O_3$ layer was formed. In particular, for nucleation of $\alpha$-$Al_2O_3$ crystal grains and subsequent formation of the $\alpha$-$Al_2O_3$ layer, the content of $H_2S$ gas in the raw material gas to be introduced was set to 0.6 vol %. The content of each gas in the composition including the $H_2S$ gas of the raw material gas is indicated in Table 2 below.

It should be noted that, for nucleation of $\alpha$-$Al_2O_3$ crystal grains, the content of $H_2S$ gas which was originally set to 0.6 vol % was momentarily made higher than 0.6 vol % and this $H_2S$ gas was introduced. After this, the content of $H_2S$ gas was set to 0.6 vol % and the raw material gas was used to grow $\alpha$-$Al_2O_3$ crystal grains and form the $\alpha$-$Al_2O_3$ layer. Respective contents of the constituent gases including $H_2S$ in the composition of the raw material gas are indicated in Table 2 below.

Particularly in Example 1, the momentarily increased content (pulse height) of $H_2S$ gas introduced for Sample A1 to Sample A7 and the time (pulse width) for which the $H_2S$ gas at the momentarily increased content is introduced were varied. Specifically, for Sample A1 to Sample A4, the content 0.6 vol % of $H_2S$ gas was set to the 150% pulse height (namely 0.9 vol %) and the pulse width was varied in a range of 0.8 to 1.3 minutes to introduce the $H_2S$ gas. In contrast, for Sample A5 and A6, the content of introduced $H_2S$ gas was not momentarily increased. For Sample A7, the content 0.6 vol % of $H_2S$ gas was set to the 130% pulse height (namely 0.78 vol %) and the pulse width was set to 1.0 minute to introduce the $H_2S$ gas. The number of times the $H_2S$ gas was introduced at the momentarily increased content is three. These conditions are those indicated in the following Table 2.

between the $\alpha$-$Al_2O_3$ layer and the TiCNO layer adjacent to the base material side surface of the $\alpha$-$Al_2O_3$ layer, toward the surface of the coating (see FIG. 1). The grain size of $\alpha$-$Al_2O_3$ crystal grains was measured at 0.5 μm away from the interface between the $\alpha$-$Al_2O_3$ layer and the TiC layer adjacent to the $\alpha$-$Al_2O_3$ layer oppositely to the base material.

TABLE 2

| | Sample No. | temperature in furnace (° C.) | pressure in furnace (hPa) | $H_2$ (vol %) | CO (vol %) | $CO_2$ (vol %) | $O_2$ (vol %) | $AlCl_3$ (vol %) | HCl (vol %) | normal $H_2S$ (vol %) | pulse height and number of times | pulse width (min) | pulse period (min) |
|---|---|---|---|---|---|---|---|---|---|---|---|---|---|
| Example | A1 | 1000 | 75 | remainder | 2 | 0.5 | 0.005 | 2 | 3 | 0.6 | 150%, 3 times | 1.0 | 5 |
| | A2 | 1000 | 75 | remainder | 2 | 0.5 | 0.005 | 2 | 3 | 0.6 | 150%, 3 times | 0.8 | 5 |
| | A3 | 1000 | 75 | remainder | 2 | 0.5 | 0.005 | 2 | 3 | 0.6 | 150%, 3 times | 1.2 | 5 |
| | A4 | 1000 | 75 | remainder | 2 | 0.5 | 0.005 | 2 | 3 | 0.6 | 150%, 3 times | 1.3 | 5 |
| Comparative Example | A5 | 1000 | 75 | remainder | 2 | 0.5 | 0.005 | 2 | 3 | 1.2 | — | — | — |
| | A6 | 1000 | 75 | remainder | 2 | 0.5 | 0.005 | 2 | 3 | 0.6 | — | — | — |
| | A7 | 1000 | 75 | remainder | 2 | 0.5 | 0.005 | 2 | 3 | 0.6 | 130%, 3 times | 1.0 | 5 |

The layer structure of the coating formed for each of Sample A1 to Sample A7 is made up of a TiN layer, a TiCN layer, a TiCNO layer, an $\alpha$-$Al_2O_3$ layer, a TiC layer, and a TiN layer in order from the base material. In the following Table 3, the layer structure of Sample A1 to Sample A7 and the thickness (μm) of each layer are indicated.

TABLE 3

| | Sample No. | layer structure and layer thickness (μm) |
|---|---|---|
| Example | A1 | base material/TiN(0.3)/TiCN(8.2)/TiCNO(1.0)/$Al_2O_3$(4.2)/TiC(0.3)/TiN(0.5) |
| | A2 | base material/TiN(0.2)/TiCN(8.5)/TiCNO(1.0)/$Al_2O_3$(4.4)/TiC(0.3)/TiN(0.4) |
| | A3 | base material/TiN(0.3)/TiCN(8.2)/TiCNO(1.0)/$Al_2O_3$(4.2)/TiC(0.3)/TiN(0.5) |
| | A4 | base material/TiN(0.3)/TiCN(8.1)/TiCNO(1.0)/$Al_2O_3$(4.1)/TiC(0.2)/TiN(0.5) |
| Comparative Example | A5 | base material/TiN(0.3)/TiCN(8.2)/TiCNO(1.0)/$Al_2O_3$(4.2)/TiC(0.3)/TiN(0.5) |
| | A6 | base material/TiN(0.3)/TiCN(8.2)/TiCNO(1.0)/$Al_2O_3$(4.2)/TiC(0.3)/TiN(0.5) |
| | A7 | base material/TiN(0.4)/TiCN(8.3)/TiCNO(1.2)/$Al_2O_3$(4.2)/TiC(0.3)/TiN(0.3) |

<Test Details>

In Example 1, as described above, six samples were prepared for each of Sample A1 to Sample A7. For the first sample out of the six samples, the flank face was irradiated with x-ray to measure the TC(006) of the $\alpha$-$Al_2O_3$ layer. For the second sample, the S content of the $\alpha$-$Al_2O_3$ layer was measured. For the third sample, the grain size of $\alpha$-$Al_2O_3$ crystal grains was measured. For the fourth sample, the slidability was evaluated. For the fifth sample, the wear resistance was evaluated. For the sixth sample, the fracture resistance was evaluated.

The S content of the $\alpha$-$Al_2O_3$ layer was measured at measurement points (first measurement point to fifth measurement point). The measurement points were set at intervals of 1 μm, from the position directly on the interface The methods of evaluating the wear resistance, the fracture resistance, and the slidability are as follows. The results of the evaluation are indicated in Table 4 below.

<Evaluation of Wear Resistance>
Workpiece: SCM435 (JIS)
Cutting Speed: 300 m/min
Feed: 0.3 mm/rev
Depth of Cut: 2.0 mm
Cutting Oil: dry
Cutting Time: 15 min
Evaluation: The wear width Vb (mm) of the flank face after cutting was performed for 15 minutes was measured.

The wear resistance is evaluated as follows. A cutting tool is set on an NC lathe, cutting of a workpiece is performed with the cutting tool for a predetermined time. After this, a wear width (Vb) formed on the flank face of the cutting tool is observed to evaluate the wear resistance. A cutting tool with a smaller value of the wear width (Vb) can be evaluated as being higher in wear resistance.

<Evaluation of Fracture Resistance>
Workpiece: SCM435 (JIS), grooved material
Cutting Speed: 200 m/min
Feed: 0.3 mm/rev
Depth of Cut: 1.5 mm
Cutting Oil: wet
Evaluation: The elapsed time (minutes) before chipping or fracture was measured.

The fracture resistance is evaluated as follows. A cutting tool is set on an NC lathe, cutting of a workpiece is performed with the cutting tool, and the elapsed time before chipping or fracture occurs to the cutting tool is measured to evaluate the fracture resistance. Therefore, a cutting tool with a longer elapsed time before chipping or fracture can be evaluated as being higher in fracture resistance.

<Evaluation of Slidability>
The slidability was evaluated by measuring the friction coefficient (μ). The friction coefficient (μ) was measured by the pin-on-disk method under conditions of a 10 N load and room temperature. A cutting tool with a smaller value of the friction coefficient (μ) has higher smoothness and can be evaluated as being higher in slidability.

TABLE 4

|  | Sample No. | XRD result TC(006) | S content (at. %) | | | | | Csmax (at. %) | Csmax – Csmin | slidability | cutting performance | | | performance rating |
|  |  |  | 1st measurement point | 2nd measurement point | 3rd measurement point | 4th measurement point | 5th measurement point |  |  | friction coefficient μ | grain size μm | wear resistance Vb (mm) | time to fracture (min) |  |
|---|---|---|---|---|---|---|---|---|---|---|---|---|---|---|
| Example | A1 | 6.77 | 0.082 | 0.020 | 0.012 | 0.008 | 0.003 | 0.082 | 0.079 | 0.35 | 0.93 | 0.161 | 6.5 | A |
|  | A2 | 5.71 | 0.050 | 0.012 | 0.007 | 0.005 | 0.003 | 0.050 | 0.047 | 0.38 | 1.85 | 0.168 | 5.9 | B |
|  | A3 | 7.79 | 0.220 | 0.051 | 0.005 | 0.006 | 0.005 | 0.220 | 0.215 | 0.33 | 0.53 | 0.154 | 7.7 | AA |
|  | A4 | 7.89 | 0.330 | 0.024 | 0.006 | 0.006 | 0.005 | 0.330 | 0.325 | 0.33 | 0.51 | 0.150 | 7.8 | AA |
| Comparative Example | A5 | 3.25 | 0.761 | 0.091 | 0.049 | 0.009 | 0.006 | 0.761 | 0.755 | 0.87 | 3.21 | 0.350 | 2.2 | C |
|  | A6 | 3.52 | 0.003 | 0.002 | 0.001 | 0.000 | 0.000 | 0.003 | 0.003 | 0.57 | 2.10 | 0.235 | 5.2 | D |
|  | A7 | 4.68 | 0.002 | 0.002 | 0.001 | 0.000 | 0.000 | 0.002 | 0.002 | 0.59 | 1.92 | 0.240 | 5.6 | C |

The rating of evaluation represented for example by symbol AA in Table 4 is defined as follows.

AA: highly excellent in wear resistance, fracture resistance, and slidability (Vb of 0.165 or less, time to fracture of 6 minutes or more, and fracture coefficient (μ) of 0.35 or less)

A: excellent in wear resistance, fracture resistance, and slidability (two of the requirements, namely Vb of 0.165 or less, time to fracture of 6 minutes or more, and fracture coefficient (μ) of 0.35 or less are satisfied)

B: sufficient in required wear resistance, fracture resistance, and slidability (Vb of 0.165 to 0.170, time to fracture of 4 to 6 minutes, and fracture coefficient (μ) of 0.35 to 0.54)

C: insufficient in wear resistance, fracture resistance, and slidability (Vb of 0.170 to 0.180 or time to fracture of 4 to 6 minutes, and fracture coefficient (μ) of more than 0.54)

D: impossible (evaluation is impossible due to occurrence of coarse grains)

<Results of Evaluation>

As seen from Table 4, Examples corresponding to Sample A1 to Sample A4 exhibit the performance that Vb (mm) is 0.170 or less and the performance that the time to fracture is 5 minutes or more and thus can be evaluated as having excellent wear resistance and fracture resistance. As to the evaluation of slidability, the friction coefficient (μ) of the Examples is 0.54 or less, and it has been made clear that particularly the Examples with a friction coefficient of 0.38 or less have sufficient slidability.

As to the XRD results in Table 4, the Examples have a TC(006) of the α-Al$_2$O$_3$ layer of more than 5. As to the S content, a Csmax of 0.05 to 0.330 at. % is obtained at the first measurement point included in the α-Al$_2$O$_3$ layer and located at a side of the TiCNO layer. In the thickness direction of the α-Al$_2$O$_3$ layer, the S content decreases in the direction away from the TiCNO layer, and a Csmin of 0.003 to 0.005 at. % is obtained at the fifth measurement point included in the α-Al$_2$O$_3$ layer and located at a side of the TiC layer. It has therefore been found that the α-Al$_2$O$_3$ layer of the Examples has a concentration distribution of S in which the concentration of S decreases in the direction away from the base-material-side surface of the α-Al$_2$O$_3$ layer in the thickness direction of the α-Al$_2$O$_3$ layer. Moreover, in the Examples, the difference between Csmax and Csmin is 0.047 to 0.325. At a location 0.5 μm away from the interface between the α-Al$_2$O$_3$ layer and the TiC layer toward the inside of the α-Al$_2$O$_3$ layer, the grain size of α-Al$_2$O$_3$ crystal grains is 1.85 μm or less.

The Comparative Examples (Samples A5, A6) for which the content of H$_2$S gas was not momentarily increased cannot be evaluated as having excellent wear resistance and fracture resistance as seen from Table 4. Moreover, the Comparative Examples fail to have sufficient slidability.

<Analysis>

In the present Examples, H$_2$S gas with a content of 0.6 vol % was introduced and additionally H$_2$S gas with a predetermined pulse width (0.8 to 1.3 minutes) and a predetermined pulse height (150%) was introduced three times to form the α-Al$_2$O$_3$ layer. The α-Al$_2$O$_3$ layer had a TC(006) of more than 5 and a concentration distribution of S in which the concentration of S decreased in the direction away from the substrate-side surface of the α-Al$_2$O$_3$ layer. The cutting tools of the Examples having a coating including such an α-Al$_2$O$_3$ layer exhibited the performance that Vb was 0.168 or less and the time to fracture was 5.9 minutes or more, and therefore had excellent wear resistance and fracture resistance. It was also clarified that the cutting tool exhibited a friction coefficient (μ) of 0.38 or less and therefore had excellent slidability as well. Accordingly, the cutting tools of the Examples can achieve an extended life.

Example 2

<Preparation of Base Material>

A base material formed of a cemented carbide base material (manufactured by Sumitomo Electric Industries, Ltd.) with a shape of CNMG120408 identical to that of Example 1 was prepared. Prepared base materials were grouped into three groups named Sample B1 to Sample B3. For each group, six base materials were prepared. These base materials had a composition made up of 92.5 wt % of WC, 6.0 wt % of Co, and 1.5 wt % of NbC. As will be described later herein, Sample B1 is an Example and Sample B2 and sample B3 are Comparative Examples.

<Formation of Coating>

The base materials of Sample B1 to Sample B3 were subjected to honing under the same conditions to those of Example 1 and set in a chemical vapor deposition apparatus, and a coating was formed on a surface of each base material by the CVD method. In Example 2, the TiN layer was not included in the structure of the coating.

In the process of forming the α-Al$_2$O$_3$ layer by the CVD method, the surface of the TiCNO layer formed on the surface of the TiCN layer was oxidized to cause nucleation of α-Al$_2$O$_3$ crystal grains, and subsequently the α-Al$_2$O$_3$ layer was formed. In particular, for nucleation of α-Al$_2$O$_3$ crystal grains and subsequent formation of the α-Al$_2$O$_3$ layer, the content of $H_2S$ gas in the raw material gas to be introduced was set to 1.7 vol %. The content of each gas in the composition including the $H_2S$ gas of the raw material gas is indicated in Table 5 below.

It should be noted that, for nucleation of $\alpha$-$Al_2O_3$ crystal grains, the content of $H_2S$ gas which was originally set to 1.7 vol % was momentarily made higher than 1.7 vol % and this $H_2S$ gas was introduced. After this, the content of $H_2S$ gas was set to 1.7 vol % and the raw material gas was used to grow $\alpha$-$Al_2O_3$ crystal grains and form the $\alpha$-$Al_2O_3$ layer. Respective contents of the constituent gases including $H_2S$ in the composition of the raw material gas are indicated in Table 5 below.

Particularly in Example 2, the period of one cycle (pulse period) in which the content of introduced $H_2S$ gas was momentarily increased was varied. Specifically, the pulse period of Sample B1 was three minutes, the pulse period of Sample B2 was seven minutes, and the pulse period of Sample B3 was one minute. Moreover, commonly to Sample B1 to Sample B3, the pulse height was set to 130% (namely 2.21 vol %) relative to the content 1.7 vol % of $H_2S$ gas, the pulse width was set to two minutes, and $H_2S$ gas with its content momentarily increased was introduced twice. These conditions are indicated in the following Table 5.

The S content of the $\alpha$-$Al_2O_3$ layer was measured at measurement points (first measurement point to fifth measurement point). The measurement point were set at intervals of 1 μm from the position directly on the interface between the $\alpha$-$Al_2O_3$ layer and the TiCNO layer adjacent to the base material side surface of the $\alpha$-$Al_2O_3$ layer, toward the surface of the coating (see FIG. 1). The grain size of $\alpha$-$Al_2O_3$ crystal grains was measured at 0.5 μm away from the interface between the $\alpha$-$Al_2O_3$ layer and the TiC layer adjacent to the $\alpha$-$Al_2O_3$ layer oppositely to the base material.

The methods of evaluating the wear resistance, the fracture resistance, and the slidability are as follows. The results of the evaluation are indicated in Table 7 below.

<Evaluation of Wear Resistance>
Workpiece: FCD700 (JIS)
Cutting Speed: 120 m/min
Feed: 0.3 mm/rev
Depth of Cut: 2.0 mm
Cutting Oil: wet
Cutting Time: 10 min
Evaluation: The wear width Vb (mm) of the flank face after cutting was performed for 10 minutes was measured.

TABLE 5

| | Sample No. | temperature in furnace (° C.) | pressure in furnace (hPa) | $H_2$ (vol %) | CO (vol %) | $CO_2$ (vol %) | $O_2$ (vol %) | $AlCl_3$ (vol %) | HCl (vol %) | normal $H_2S$ (vol %) | pulse height and number of times | pulse width (min) | pulse period (min) |
|---|---|---|---|---|---|---|---|---|---|---|---|---|---|
| Example | B1 | 980 | 85 | remainder | 3 | 1.5 | 0.007 | 1.5 | 4 | 1.7 | 130%, twice | 2.0 | 3 |
| Comparative Example | B2 | 980 | 85 | remainder | 3 | 1.5 | 0.007 | 1.5 | 4 | 1.7 | 130%, twice | 2.0 | 7 |
| | B3 | 980 | 85 | remainder | 3 | 1.5 | 0.007 | 1.5 | 4 | 1.7 | 130%, twice | 2.0 | 1 |

The layer structure of the coating formed for each of Sample B1 to Sample B3 is made up of a TiN layer, a TiCN layer, a TiCNO layer, an $\alpha$-$Al_2O_3$ layer, and a TiC layer in order from the base material. In the following Table 6, the layer structure of Sample B1 to Sample B3 and the thickness (μm) of each layer are indicated.

TABLE 6

| | Sample No. | layer structure and layer thickness (μm) |
|---|---|---|
| Example | B1 | base material/TiN(0.3)/TiCN(9.8)/TiCNO(1.0)/Al2O3(6.2)/TiC(0.3) |
| Comparative Example | B2 | base material/TiN(0.3)/TiCN(9.8)/TiCNO(1.0)/Al2O3(6.2)/TiC(0.3) |
| | B3 | base material/TiN(0.2)/TiCN(9.7)/TiCNO(1.1)/Al2O3(6.5)/TiC(0.3) |

<Test Details>

In Example 2, as described above, six samples were prepared for each of Sample B1 to Sample B3. For the first sample out of the six samples, the flank face was irradiated with x-ray to measure the TC(006) of the $\alpha$-$Al_2O_3$ layer. For the second sample, the S content of the $\alpha$-$Al_2O_3$ layer was measured. For the third sample, the grain size of $\alpha$-$Al_2O_3$ crystal grains was measured. For the fourth sample, the slidability was evaluated. For the fifth sample, the wear resistance was evaluated. For the sixth sample, the fracture resistance was evaluated.

The wear resistance is evaluated as follows. A cutting tool is set on an NC lathe, cutting of a workpiece is performed with the cutting tool for a predetermined time. After this, a wear width (Vb) formed on the flank face of the cutting tool is observed to evaluate the wear resistance. A cutting tool with a smaller value of the wear width (Vb) can be evaluated as being higher in wear resistance.

<Evaluation of Fracture Resistance>
Workpiece: FCD450 (JIS), grooved material
Cutting Speed: 250 m/min
Feed: 0.2 mm/rev
Depth of Cut: 1.5 mm
Cutting Oil: wet
Evaluation: The elapsed time (minutes) before chipping or fracture was measured.

The fracture resistance is evaluated as follows. A cutting tool is set on an NC lathe, cutting of a workpiece is performed with the cutting tool, and the elapsed time before chipping or fracture occurs to the cutting tool is measured to evaluate the fracture resistance. Therefore, a cutting tool with a longer elapsed time before chipping or fracture can be evaluated as being higher in fracture resistance.

<Evaluation of Slidability>

The slidability was evaluated by measuring the friction coefficient (μ). The friction coefficient (μ) was measured by the pin-on-disk method under conditions of a 10 N load and room temperature. A cutting tool with a smaller value of the friction coefficient (μ) has higher smoothness and can be evaluated as being higher in slidability.

TABLE 7

| | Sample No. | XRD result TC(006) | S content (at. %) | | | | | | | slidability | | cutting performance | | performance rating |
| | | | 1st measurement point | 2nd measurement point | 3rd measurement point | 4th measurement point | 5th measurement point | Csmax (at. %) | Csmax − Csmin | friction coefficient μ | grain size μm | wear resistance Vb (mm) | time to fracture (min) | |
|---|---|---|---|---|---|---|---|---|---|---|---|---|---|---|
| Example | B1 | 7.38 | 0.850 | 0.087 | 0.067 | 0.009 | 0.008 | 0.850 | 0.842 | 0.39 | 0.83 | 0.156 | 4.2 | B |
| Comparative | B2 | 3.87 | 0.003 | 0.003 | 0.002 | 0.002 | 0.002 | 0.003 | 0.001 | 0.58 | 2.11 | 0.178 | 2.1 | C |
| Example | B3 | 4.15 | 1.205 | 0.150 | 0.023 | 0.009 | 0.008 | 1.205 | 1.197 | 0.92 | 3.18 | 0.212 | 1.6 | D |

The rating of evaluation represented for example by symbol AA in Table 7 is defined as follows.

AA: highly excellent in wear resistance, fracture resistance, and slidability (Vb of 0.165 or less, time to fracture of 6 minutes or more, and fracture coefficient (μ) of 0.35 or less)

A: excellent in wear resistance, fracture resistance, and slidability (two of the requirements, namely Vb of 0.165 or less, time to fracture of 6 minutes or more, and fracture coefficient (μ) of 0.35 or less are satisfied)

B: sufficient in required wear resistance, fracture resistance, and slidability (Vb of 0.165 to 0.170, time to fracture of 4 to 6 minutes, and fracture coefficient (μ) of 0.35 to 0.54)

C: insufficient in wear resistance, fracture resistance, and slidability (Vb of 0.170 to 0.180 or time to fracture of 4 to 6 minutes, and fracture coefficient (μ) of more than 0.54)

D: impossible (evaluation is impossible due to occurrence of coarse grains)

<Results of Evaluation>

As seen from Table 7, the Example corresponding to Sample B1 exhibits the performance that Vb (mm) is 0.156 and the performance that the time to fracture is 4.2 minutes and thus can be evaluated as having excellent wear resistance and fracture resistance. As to the evaluation of slidability, the friction coefficient (μ) of the Example is 0.39, and it has been made clear that the Example with a friction coefficient of 0.39 has sufficient slidability.

As to the XRD results in Table 7, the Example has a TC(006) of the α-$Al_2O_3$ layer of more than 5. As to the S content, a Csmax of 0.0850 at. % is obtained at the first measurement point included in the α-$Al_2O_3$ layer and located at a side of the TiCNO layer. In the thickness direction of the α-$Al_2O_3$ layer, the S content decreases in the direction away from the TiCNO layer, and a Csmin of 0.008 at. % is obtained at the fifth measurement point included in the α-$Al_2O_3$ layer and located at a side of the TiC layer. It has therefore been found that the α-$Al_2O_3$ layer of the Example has a concentration distribution of S in which the concentration of S decreases in the direction away from the base-material-side surface of the α-$Al_2O_3$ layer in the thickness direction of the α-$Al_2O_3$ layer. Moreover, in the Example, the difference between Csmax and Csmin is 0.842. At a location at 0.5 μm away from the interface between the α-$Al_2O_3$ layer and the TiC layer toward the inside of the α-$Al_2O_3$ layer, the grain size of α-$Al_2O_3$ crystal grains is 0.83 μm.

<Analysis>

In the present Example, $H_2S$ gas with a content of 1.7 vol % was introduced and additionally $H_2S$ gas with its content increased momentarily for each predetermined pulse period (3 minutes) was introduced twice to form the α-$Al_2O_3$ layer. The α-$Al_2O_3$ layer had a TC(006) of more than 5 and a concentration distribution of S in which the concentration of S decreased in the direction away from the substrate-side surface of the α-$Al_2O_3$ layer. It was found that the cutting tools of the Example having a coating including such an α-$Al_2O_3$ layer exhibited the performance that Vb was 0.156 and the time to fracture was 4.2 minutes, and was therefore sufficient in necessary wear resistance and fracture resistance. It was also clarified that the cutting tool exhibited a friction coefficient (μ) of 0.39 and therefore had excellent slidability as well. Accordingly, the cutting tool of the Example can achieve an extended life.

As clearly seen from Tables 4 and 7 that the surface-coated cutting tools of the Examples are excellent in wear resistance, fracture resistance, and slidability of the cutting edge. Accordingly, each Example is considered as being excellent as compared with each Comparative Example and as being capable of achieving an extended life.

While the embodiment and examples of the present invention have been described above, it is originally intended that the above-described features of the embodiment and examples may be combined as appropriate or modified in various manners.

It should be construed that the embodiment disclosed herein is given by way of example in all respects, not by way of limitation. It is intended that the scope of the present invention is defined by claims, not by the above-described embodiment, and encompasses all modifications equivalent in meaning and scope to the claims.

REFERENCE SIGNS LIST

1 α-$Al_2O_3$ layer; 2 TiCN layer; 3 TiCNO layer; 4 measurement point; 41 first measurement point; 42 second measurement point; 43 third measurement point; 44 fourth measurement point; 45 fifth measurement point

The invention claimed is:

1. A surface-coated cutting tool comprising a base material and a coating formed on the base material,
the coating including an α-$Al_2O_3$ layer comprising an α-$Al_2O_3$ nucleation phase and having a base-material-side surface and an opposite surface opposite to the base-material-side surface,
the α-$Al_2O_3$ layer containing a plurality of α-$Al_2O_3$ crystal grains and sulfur, and having a TC(006) of more than 5 in texture coefficient TC(hkl), and
the sulfur having a concentration distribution in which a concentration of the sulfur decreases in a direction away from the base-material-side surface of the α-$Al_2O_3$ layer, in a thickness direction of the α-$Al_2O_3$ layer, wherein
the concentration distribution satisfies a relation: an S content at point X>an S content at point Y, wherein point X is a point directly above and contacting an interface between the α-$Al_2O_3$ layer and the base material or is a point directly above and contacting an interface between the α-Al$_2$O$_3$ layer and an adjacent layer, and point Y is a point immediately below the opposite surface of the α-Al$_2$O$_3$ layer, the S content at point X shows a maximum value in the thickness direction of the α-Al$_2$O$_3$ layer, and the adjacent layer is a layer adjacent to the α-Al$_2$O$_3$ layer and is located on the same side as the base material, in the thickness direction of the α-Al$_2$O$_3$ layer.

2. The surface-coated cutting tool according to claim 1, wherein the α-Al$_2$O$_3$ crystal grains having a grain size of 0.2 to 2 μm occupy 20 to 80% by area of a measurement surface, the measurement surface is in parallel with a surface of the α-Al$_2$O$_3$ layer or parallel with an interface between the α-Al$_2$O$_3$ layer and an adjacent layer, the adjacent layer is adjacent to the α-Al$_2$O$_3$ layer and located on an opposite side to the base material, and the measurement surface is located at a depth of 0.5 μm from the surface of the α-Al$_2$O$_3$ layer or the interface.

3. The surface-coated cutting tool according to claim 1, wherein the TC(006) is more than 6.

4. The surface-coated cutting tool according to claim 1, wherein the TC(006) is more than 7.

5. The surface-coated cutting tool according to claim 1, wherein a maximum concentration Csmax of the sulfur in the concentration distribution appears in a region of 1 μm from an interface between the α-Al$_2$O$_3$ layer and the base material, or from an interface between the α-Al$_2$O$_3$ layer and a layer adjacent to the α-Al$_2$O$_3$ layer and located on the same side as the base material, in the thickness direction of the α-Al$_2$O$_3$ layer, and a minimum concentration Csmin of the sulfur in the concentration distribution appears in a region of 1 μm from a surface of the α-Al$_2$O$_3$ layer or from an interface between the α-Al$_2$O$_3$ layer and a layer adjacent to the α-Al$_2$O$_3$ layer and located on an opposite side to the base material, in the thickness direction of the α-Al$_2$O$_3$ layer, and the Csmax is 0.005 to 1 at. %, the Csmin is 0.001 to 0.1 at. %, and the Csmax and the Csmin meet a relation Csmax>Csmin.

6. The surface-coated cutting tool according to claim 1, wherein a maximum concentration Csmax of the sulfur in the concentration distribution is 0.005 to 1 at. %.

7. The surface-coated cutting tool according to claim 1, wherein the α-Al$_2$O$_3$ layer has an average layer thickness of 1 to 15 μm.

8. The surface-coated cutting tool according to claim 1, wherein in a surface of the coating, an outermost surface layer in which any one of Ti carbide, Ti nitride, and Ti boride is a main component is disposed.

9. The surface-coated cutting tool according to claim 1, wherein the coating has an intermediate layer between the α-Al$_2$O$_3$ layer and the base material, the intermediate layer contains acicular TiCNO or acicular TiBN and has an average layer thickness of 0.3 to 1 μm, and a difference between a maximum thickness and a minimum thickness of the intermediate layer is 0.3 μm or more.

10. The surface-coated cutting tool according to claim 1, wherein a content of H2S gas contained in a raw material gas in a nucleation formation of the α-Al$_2$O$_3$ layer is 0.5 to 5 vol. %.

11. A method of manufacturing a surface-coated cutting tool as recited in claim 1, the method comprising the step of forming, on the base material by a CVD method, the coating including the α-Al$_2$O$_3$ layer, in the step, a content of H2S gas contained in a raw material gas in an initial stage of formation of the α-Al$_2$O$_3$ layer being 0.5 to 5 vol %, and the content of H2S gas being momentarily increased to 0.65 to 7 vol %.

* * * * *

UNITED STATES PATENT AND TRADEMARK OFFICE
CERTIFICATE OF CORRECTION

PATENT NO. : 10,058,924 B2
APPLICATION NO. : 15/103381
DATED : August 28, 2018
INVENTOR(S) : Hideaki Kanaoka et al.

Page 1 of 1

It is certified that error appears in the above-identified patent and that said Letters Patent is hereby corrected as shown below:

In the Claims

Column 22, Claim 10, Line 29, "a content of H2S gas" should be -- a content of $H_2S$ gas --

Column 22, Claim 11, Line 36, "a content of H2S gas" should be -- a content of $H_2S$ gas --

Column 22, Claim 11, Line 39, "a content of H2S gas" should be -- a content of $H_2S$ gas --

Signed and Sealed this
Twenty-fifth Day of December, 2018

Andrei Iancu
*Director of the United States Patent and Trademark Office*